US010868361B2

(12) United States Patent
Ahn et al.

(10) Patent No.: US 10,868,361 B2
(45) Date of Patent: Dec. 15, 2020

(54) ANTENNA STRUCTURE AND ELECTRONIC DEVICE INCLUDING SAME

(71) Applicant: SAMSUNG ELECTRONICS CO., LTD., Suwon-si (KR)

(72) Inventors: Jungho Ahn, Suwon-si (KR); Jaebong Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 104 days.

(21) Appl. No.: 16/292,665

(22) Filed: Mar. 5, 2019

(65) Prior Publication Data
US 2019/0280375 A1 Sep. 12, 2019

(30) Foreign Application Priority Data
Mar. 6, 2018 (KR) .......................... 10-2018-0026175

(51) Int. Cl.
*H01M 8/10* (2016.01)
*H01Q 1/38* (2006.01)
(Continued)

(52) U.S. Cl.
CPC ............. *H01Q 1/38* (2013.01); *G06F 1/1698* (2013.01); *H01Q 9/06* (2013.01); *H05K 1/0296* (2013.01)

(58) Field of Classification Search
CPC ............ H01Q 1/38; H01Q 1/36; H01Q 1/364; H01Q 1/42; H01Q 1/44; H01Q 9/06;
(Continued)

(56) References Cited

U.S. PATENT DOCUMENTS 7,411,134 B1    8/2008 Steinfeld et al.
8,223,077 B2 *  7/2012 Chiang .................. H01Q 21/28
                                                       343/702
(Continued)

FOREIGN PATENT DOCUMENTS

KR    10-2004-0030365    4/2004
KR    10-0664216         1/2007
(Continued)

OTHER PUBLICATIONS

Search Report and Written Opinion dated Jun. 12, 2019 in counterpart International Patent Application No. PCT/KR2019/002562.

*Primary Examiner* — Raymond Alejandro
(74) *Attorney, Agent, or Firm* — Nixon & Vanderhye, P.C.

(57) ABSTRACT

An electronic device according to various embodiments may include: a first conductive plate; a second conductive plate spaced apart from the first conductive plate and substantially parallel to the first conductive plate, wherein the second conductive plate at least partially overlaps the first conductive plate when viewed from above the first conductive plate and the second conductive plate is electrically connected to a first point of the first conductive plate; a conductive pattern spaced apart from the first conductive plate and substantially parallel to the first conductive plate, wherein the conductive pattern at least partially overlaps the first conductive plate when viewed from above the first conductive plate and the first conductive plate is interposed between the conductive pattern and the second conductive plate; a wireless communication circuit electrically connected to a second point of the conductive pattern, wherein the second point of the conductive pattern overlaps a third point of the first conductive plate when viewed from above the first conductive plate; and a switch element comprising a switch configured to selectively electrically connect a fourth point of the first (Continued)

conductive plate and a fifth point of the second conductive plate, wherein the fourth point of the first conductive plate may be closer to the third point of the first conductive plate than the fourth point of the first conductive plate is to the first point of the first conductive plate.

20 Claims, 13 Drawing Sheets

(51) Int. Cl.
*H01Q 9/06* (2006.01)
*H05K 1/02* (2006.01)
*G06F 1/16* (2006.01)

(58) Field of Classification Search
CPC ....... H01Q 9/04; G06F 1/1698; G06F 1/1675; G06F 1/1679; H05K 1/0296; H01M 10/425; H01M 10/4278; H01M 10/4271; H01M 8/10
See application file for complete search history.

(56) References Cited

U.S. PATENT DOCUMENTS

| | | | |
|---|---|---|---|
| 8,525,470 | B2 | 9/2013 | Gale et al. |
| 9,136,590 | B2 * | 9/2015 | Hotta ................. H01Q 9/42 |
| 2004/0113854 | A1 | 6/2004 | Lindenmeier |
| 2008/0018541 | A1 * | 1/2008 | Pang ................. H01Q 1/243 |
| | | | 343/702 |
| 2011/0269419 | A1 | 11/2011 | Masliah |
| 2012/0176278 | A1 | 7/2012 | Merz et al. |
| 2013/0090072 | A1 | 4/2013 | Lim et al. |
| 2014/0333495 | A1 | 11/2014 | Vazquez et al. |
| 2015/0280319 | A1 | 10/2015 | Yeh |
| 2016/0164192 | A1 | 6/2016 | Lin |
| 2017/0047639 | A1 | 2/2017 | Lee et al. |

FOREIGN PATENT DOCUMENTS

| | | |
|---|---|---|
| KR | 10-0972846 | 3/2010 |
| KR | 10-2011-0131750 | 12/2011 |
| KR | 10-2013-0038515 | 4/2013 |
| KR | 10-1265096 | 5/2013 |
| KR | 10-02013-0090758 | 8/2013 |
| KR | 10-2017-0018682 | 2/2017 |

* cited by examiner

ANTENNA STRUCTURE AND ELECTRONIC DEVICE INCLUDING SAME

CROSS-REFERENCE TO RELATED APPLICATION

This application is based on and claims priority under 35 U.S.C. § 119 to Korean patent application no. 10-2018-0026175, filed on Mar. 6, 2018 in the Korean Intellectual Property Office, the disclosure of which is incorporated by reference herein in its entirety.

BACKGROUND

1) Field

The disclosure relates to an antenna structure and an electronic device including the same.

2) Description of Related Art

Due to the development of information and communication technology and semiconductor technology, the distribution and use of electronic devices are rapidly increasing. These electronic devices tend to converge and provide various functions, rather than staying in their own domains. For example, an electronic device is able to provide a wireless communication function so as to allow information to be exchanged between the distributed components thereof.

These electronic devices may be implemented in a small size, and may include antennas depending on space constraints and low power consumption requirements.

An electronic device may be able to wirelessly communicate with various apparatuses, such as an automobile, a washing machine, a refrigerator, or a TV. For example, recently emerging electronic devices are demanded to support multi-band wireless communication and to support wide bandwidth for high-speed communication in order to support wireless communication with various apparatuses.

With such demands, one electronic device may include a plurality of antennas, but space constraints may occur due to the trend toward miniaturization and weight reduction of electronic devices. For example, the lower the frequency band that an electronic device supports, the more likely there may be a difficulty since it is necessary to mount a longer and wider radiator or ground portion for effective radio communication.

In addition, since there is a difference in frequency bands allowed for respective countries, it may be necessary to adaptively shift a resonance frequency band as the use environment of an electronic device changes.

The above information is presented as background information only to assist with an understanding of the present disclosure. No determination has been made, and no assertion is made, as to whether any of the above might be applicable as prior art with regard to the present disclosure.

SUMMARY

According to various embodiments of the present disclosure, an electronic device is able to use a second conductive plate as an extended ground portion by connecting the second conductive plate to a first conductive plate included in a printed circuit board. According to an embodiment, the electronic device is able to adjust the length of the extended ground portion and to shift the resonance frequency using a switch element included in the printed circuit board.

According to various embodiments of the present disclosure, it is possible to provide an antenna structure, which is included in a limited mounting space in an electronic device, so that radiation efficiency can be improved and a resonance frequency band can be shifted using the antenna structure, and to provide an electronic device including the antenna structure.

An electronic device according to various embodiments may include: a first conductive plate; a second conductive plate spaced apart from the first conductive plate and substantially parallel to the first conductive plate, the second conductive plate at least partially overlapping the first conductive plate when viewed from above the first plate and electrically connected to a first point of the first conductive plate; a conductive pattern spaced apart from the first conductive plate and substantially parallel to the first conductive plate, the conductive pattern at least partially overlapping the first conductive plate when viewed from above the first conductive plate, wherein the first conductive plate is interposed between the conductive pattern and the second conductive plate; a wireless communication circuit electrically connected to a second point of the conductive pattern, wherein the second point overlaps a third point of the first conductive plate when viewed from above the first conductive plate; and a switch element comprising a switch configured to selectively electrically connect a fourth point of the first conductive plate and a fifth point of the second conductive plate, wherein the fourth point of the first conductive plate may be closer to the third point of the first conductive plate than the fourth point of the first conductive plate is to the first point of the first conductive plate.

An electronic device according to various embodiments may include: a first conductive plate; a second conductive plate spaced apart from the first conductive plate and substantially parallel to the first conductive plate, wherein the second conductive plate at least partially overlaps the first conductive plate when viewed from above the first plate and is electrically connected to a first point of the first conductive plate; a conductive pattern spaced apart from the first conductive plate and substantially parallel to the first conductive plate, wherein the conductive pattern at least partially overlaps the first conductive plate when viewed from above the first conductive plate and the first conductive plate is interposed between the conductive pattern and the second conductive plate; a wireless communication circuit electrically connected to a second point of the conductive pattern, wherein the second point overlaps a third point of the first conductive plate when viewed from above the first conductive plate; and a switch element comprising a switch configured to selectively electrically connect a fourth point of the first conductive plate and a fifth point of the second conductive plate, wherein the third point is located between the fourth point and the first point. At least a portion of the conductive pattern may be electrically connected to the fourth point of the first conductive plate by a via hole.

According to various embodiments, an electronic device may include: a housing including a first housing and a second housing; a printed circuit board including a first conductive plate, a wireless communication circuit electrically connected to a second point of a conductive pattern, and a switch electrically connecting a fourth point of the first conductive plate and a fifth point of a second conductive plate; a first support disposed between the printed circuit board and the first housing and including the second conductive plate electrically connected to a first point of the first conductive plate; a second support disposed between the printed circuit board and the second housing and including the conductive pattern; and a processor. The processor may be configured to control a connection between the fourth point of the first conductive plate and the fifth point of the second conductive plate using the switch, and the second point may overlap a third point of the first conductive plate when viewed from above the first conductive plate, and the fourth point of the first conductive plate may be closer to the third point of the first conductive plate than the fourth point of the first conductive plate is to the first point of the first conductive plate.

According to various embodiments of the present disclosure, it is possible to provide an antenna structure capable of supporting simple roaming even when the use environment changes, and an electronic device including the antenna structure. As another example, it is possible to support data communication in multiple bands.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
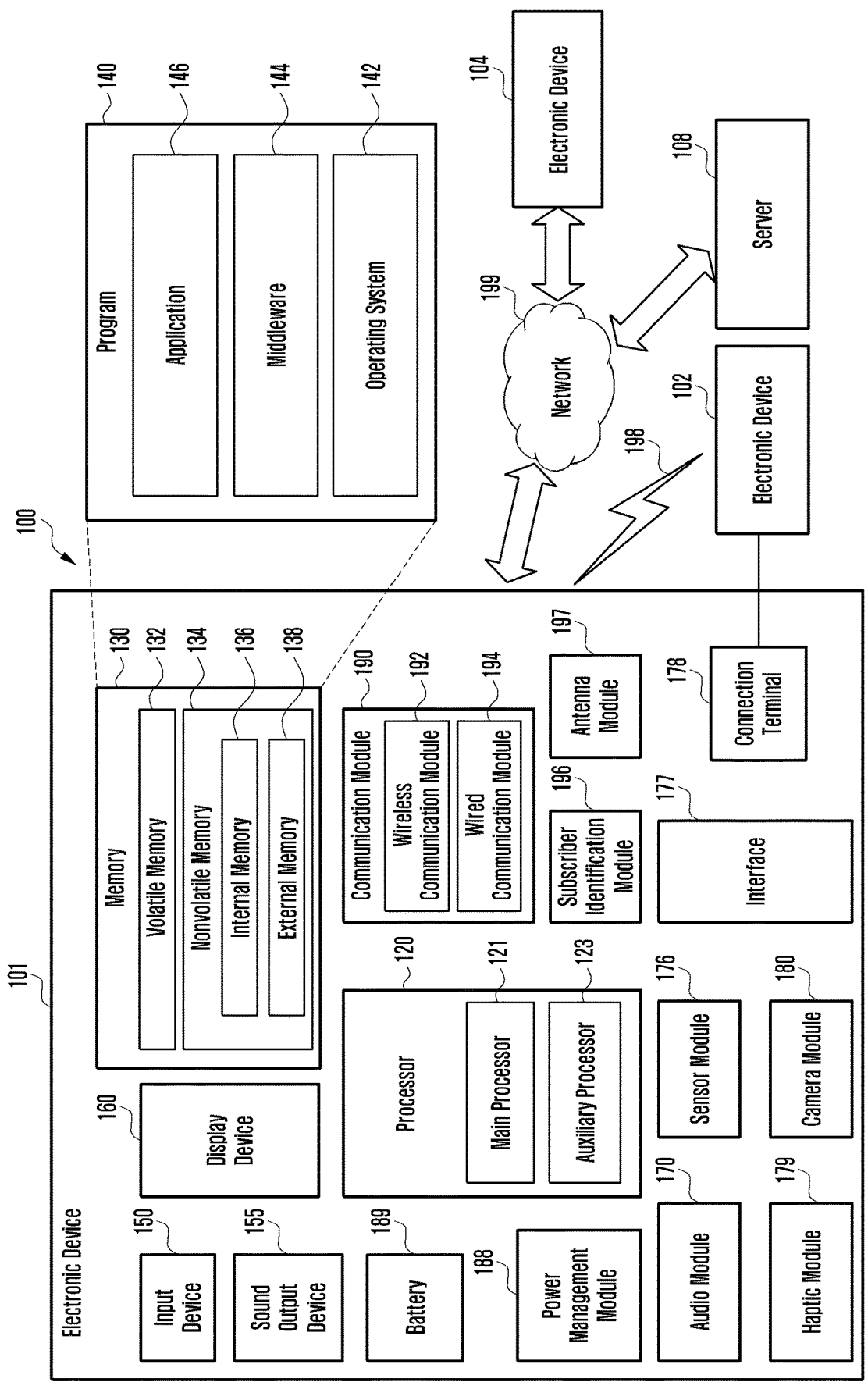
FIG. 1 is a block diagram illustrating an example electronic device in a network environment, according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
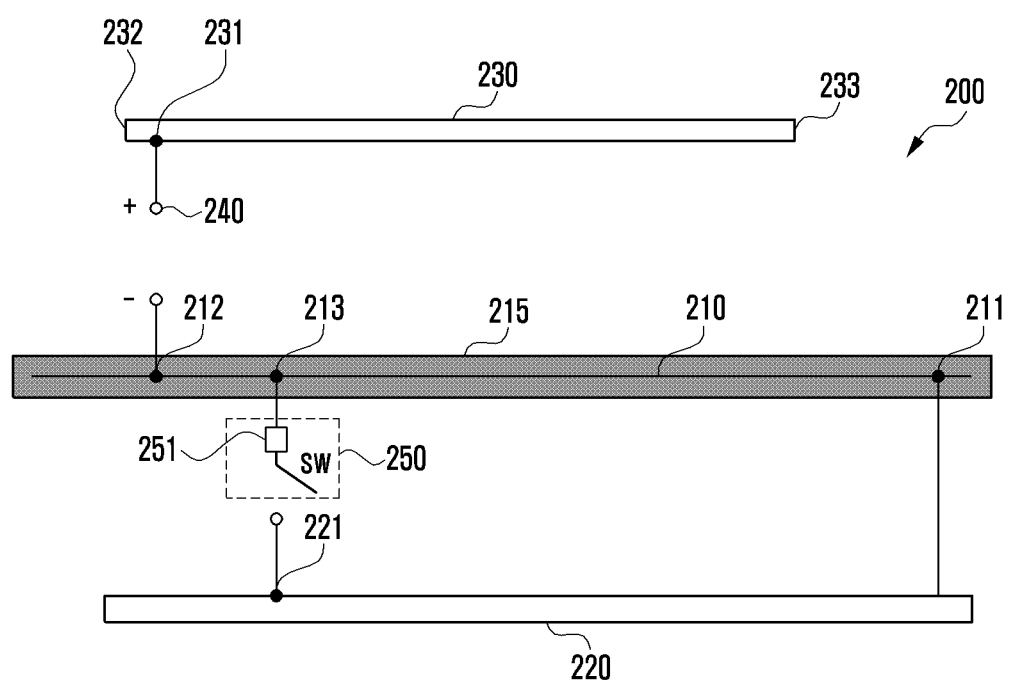
FIG. 2 is a diagram illustrating an example antenna structure according to various embodiments.

FIG. 2 is a diagram illustrating an example antenna structure according to various embodiments.

Referring to FIG. 2, an antenna structure 200 (e.g., the antenna module 197 in FIG. 1) may include a first conductive plate 210, a second conductive plate 220, a conductive pattern 230, a feeding portion 240, and a switch element (e.g., including a switch) 250. According to some embodiments, at least one of the components may be omitted from the antenna structure 200 or other components may be added to the antenna structure 200.

According to various embodiments, the first conductive plate 210 may be included in a Printed Circuit Board (PCB) 215. For example, the first conductive plate 210 may form a ground portion within the printed circuit board 215.

According to various embodiments, the second conductive plate 220 may be spaced apart from the first conductive plate 210 and substantially parallel to the first conductive plate 210, and the second conductive plate 220 may be disposed to at least partially overlap the first conductive plate 210 when viewed from above the first conductive plate 210. The second conductive plate 220 may be electrically connected to a first point 211 of the first conductive plate 210. According to various embodiments, the second conductive plate 220 may be used as an extended ground portion of the printed circuit board 215 by being electrically connected with the first conductive plate 210. According to various embodiments, the first point 211 may be located on or near one end of the first conductive plate 210.

According to an embodiment, the second conductive plate may extend at least partially in a direction toward the other end of the first conductive plate 210 opposite the first point 211. For example, the second conductive plate 220 may be attached or mounted on one face of the printed circuit board 215, and may extend at least partially toward the other end of the first conductive plate 210. As another example, the second conductive plate 220 may be included in another support member separated from the printed circuit board 215, and may extend at least partially toward the other end of the first conductive plate 210.

According to various embodiments, the conductive pattern 230 may be spaced apart from the first conductive plate 210 and substantially parallel to the first conductive plate 210, and the conductive pattern 230 may be disposed to at least partially overlap the first conductive plate 210 when viewed from above the first conductive plate 210. The first conductive plate 210 may be interposed between the conductive pattern 230 and the second conductive plate 220.

According to various embodiments, the antenna structure 200 may be designed to support wireless communication in a desired resonance frequency band by varying the length or shape of the conductive pattern. For example, the conductive pattern 230 may include a conductive line including a first end 232 and a second end 233. The length of the conductive line may be determined depending on the supported resonance frequency and the feeding position.

According to an embodiment, the antenna structure 200 may include a plurality of conductive patterns 230. In this case, the plurality of conductive patterns 230 may have different lengths and shapes, respectively, and may support different resonance frequency bands, respectively.

According to various embodiments, the feeding portion 240 may be electrically connected to the second point 231 of the conductive pattern 230. According to an embodiment, the second point 231 may overlap a third point 212 of the first conductive plate 210 when viewed from above the first conductive plate 210.

According to various embodiments, the feeding portion 240 includes a feed point and a feeding line, and may be connected to a radiation pattern via a connection member (e.g., a C-clip) so as to transmit a feed signal. According to an embodiment, the antenna structure 200 may include a wireless communication circuit (e.g., the communication module 190 in FIG. 1) that is connected to the feeding portion 240.

According to various embodiments, the switch element 250 may include a switch, and may be electrically connected between a fourth point 213 of the first conductive plate 210 and a fifth point 221 of the second conductive plate 220. The fourth point 213 of the first conductive plate 210 and the fifth point 221 of the second conductive plate 220 may be electrically connected via the switch element 250. In this case, since the length of the ground portion is changed using the switch element 250, the resonance frequency may be shifted. For example, when the first switch element 250 is opened, the antenna structure 200 may use a portion extending by the length of the second conductive plate 220 from the third point 212 through the first point 211, as a ground portion of a monopole antenna. As another example, when the switch element 250 is short-circuited (e.g., the switch is closed), the ground portion of the monopole antenna is shortened, and the resonance frequency may be shifted. In this case, since the ground portion maintains its size, even if the resonance frequency is shifted, radiation efficiency performance may not deteriorate greatly.

According to various embodiments, the switch element 250 may include various components connected to a communication circuit (e.g., the communication module 190) and performing an operation in accordance with the control signal. For example, the switch element 250 may include a switch (e.g., a mems switch, SPDT) and/or a matching circuit 251 (e.g., a lumped element or a tunable circuit).

According to various embodiments, the matching circuit 251 may be included in the switch element 250 or disposed between the switch element 250 and the first conductive plate 210. The matching circuit 251 may suppress noise generated when the switch element 250 is short-circuited or opened, thereby improving circuit stability. The matching circuit 251 may include, for example, a capacitor or an inductor. When the capacitance value or the inductance value in the matching circuit 251 is adjusted, the resonance frequency to be provided through the antenna structure can be shifted.

An electronic device (e.g., the electronic device 101 in FIG. 1) according to various embodiments may include: a first conductive plate 201; a second conductive plate 220 spaced apart from the first conductive plate 210 and substantially parallel to the first conductive plate 210, wherein the second conductive plate 220 at least partially overlaps the first conductive plate 210 when viewed from above the first conductive plate 210 and is electrically connected to a first point 211 of the first conductive plate 210; a conductive pattern 230 spaced apart from the first conductive plate 210 and substantially parallel to the first conductive plate 210, wherein the conductive pattern 230 at least partially overlaps the first conductive plate 210 when viewed from above the first conductive plate 210 and the first conductive plate 210 is interposed between the conductive pattern 230 and the second conductive plate 220; a wireless communication circuit electrically connected to a second point 231 of the conductive pattern, wherein the second point 231 overlaps a third point 212 of the first conductive plate 210 when viewed from above the first conductive plate 210; and a switch element 250 comprising a switch and is selectively electrically connected between a fourth point 213 of the first conductive plate 210 and a fifth point 221 of the second conductive plate 220, wherein the fourth point 213 may be closer to the third point 212 than to the first point 211.

According to various embodiments, the conductive pattern 230 of the antenna structure 200 includes a conductive line including a first end 232 and a second end 233, and the second point 231 may be located at or near the first end 232.

According to various embodiments, the conductive line of the antenna structure 200 may not overlap the first point 211 when viewed from above the first conductive plate 210.

According to various embodiments, the antenna structure 200 may further include a matching circuit 251 connected between the switch element 250 and the fifth point 221.

According to various embodiments, the antenna structure 200 may further include a printed circuit board (PCB) 215 including the first conductive plate 210.

Figure 3:
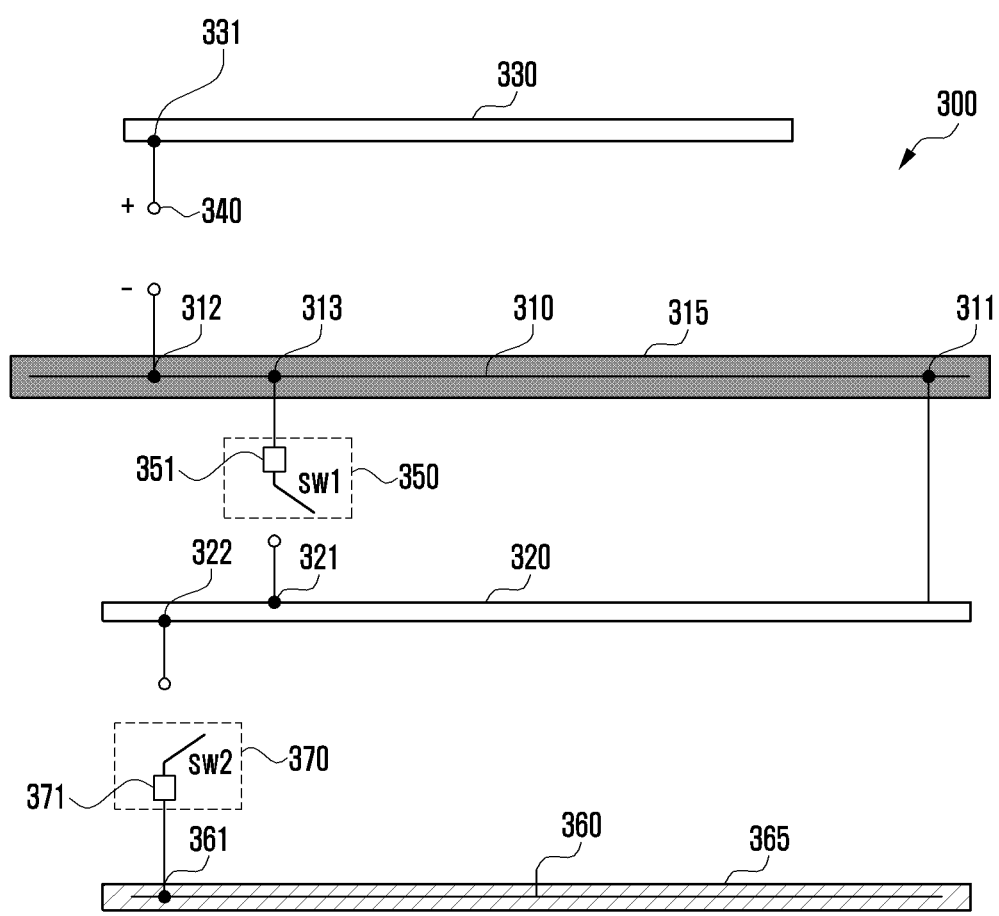
FIG. 3 is a diagram illustrating an example antenna structure according to various embodiments.

FIG. 3 is a diagram illustrating an example antenna structure according to various embodiments;

Referring to FIG. 3, an antenna structure 300 (e.g., the antenna module 197 in FIG. 1 or the antenna structure 200 in FIG. 2) may include a first conductive plate 310, a second conductive plate 320, a conductive pattern 330, a feeding portion 340, a first switch element (e.g., including a switch) 350, a third conductive plate 360, and a second switch element (e.g., including a switch) 370. According to some embodiments, at least one of the components may be omitted from the antenna structure 300 or other components may be added to the antenna structure 300.

Referring to FIG. 3, the first conductive plate 310, the second conductive plate 320, the conductive pattern 330, the feeding portion 340, and the first switch element 350 are substantially the same as or similar to the first conductive plate 210, the second conductive plate 220, the conductive pattern 230, the feeding portion 240, and the switch element 250 of FIG. 2, respectively. Therefore, a detailed description overlapping the description made with reference to FIG. 2 may not be repeated here. For example, an electronic device (e.g., the electronic device 101 in FIG. 1) may include a first conductive plate 310, and a second conductive plate 320 spaced apart from the first conductive plate 310 and substantially parallel to the first conductive plate 310, in which the second conductive plate 320 may be disposed to at least partially overlap the first conductive plate 310 when viewed from above the first conductive plate 310. The second conductive plate 320 may be electrically connected to a first point 311 of the first conductive plate 310. The electronic device may include a conductive pattern 330 spaced apart from the first conductive plate 310 and substantially parallel to the first conductive plate 310, wherein the conductive pattern 330 may be disposed to at least partially overlap the first conductive plate 310 when viewed from above the first conductive plate 310. The first conductive plate 310 may be interposed between the conductive pattern 330 and the second conductive plate 320. The electronic device may include a wireless communication circuit (e.g., the communication module 190 in FIG. 1) electrically connected to the second point 331 of the conductive pattern 330, wherein the second point 331 overlaps a third point 312 of the first conductive plate 310 when viewed from above the first conductive plate 310. The electronic device may include a switch element 350 selectively electrically connected between a fourth point 313 of the first conductive plate 310 and a fifth point 321 of the second conductive plate 320. The fourth point 313 may be closer to the third point 312 than to the first point 311.

According to various embodiments, the antenna structure 300 may include a second switch element 370 that is able to selectively electrically connect the third conductive plate 360 and the second conductive plate 320. The third conductive plate 360 connected to the second conductive plate 320 via the second switch element 370 may be used as a ground portion.

According to various embodiments, the third conductive plate 360 may be included in an internal component of the electronic device including the antenna structure 300, or in the housing of the electronic device. In some embodiments, a third conductive plate 360 may be included in an external device. In this case, one antenna structure 300 may be formed by coupling the external device to the electronic device.

According to various embodiments, the antenna structure 300 may include a second switch element 370 and a matching circuit 371 in a separate region (e.g., a second printed circuit board 365) separated from the first printed circuit board 315. According to an embodiment, the second printed circuit board 365 may include the third conductive plate 360. According to various embodiments, the second switch element 370 may be mounted on the second printed circuit board 365 to control the connection between the third conductive plate 360 and the second conductive plate 320. For example, the second switch element 370 may be electrically connected between a sixth point 322 of the second conductive plate 320 and a seventh point 361 of the third conductive plate 360.

According to various embodiments, the electronic device (e.g., the electronic device 101 in FIG. 1) may further include: a third conductive plate 360 spaced apart from the first conductive plate 310 and substantially parallel to the first conductive plate 310, wherein the third conductive plate 360 at least partially overlaps the first conductive plate 310 when viewed from above the first conductive plate 310 and the second conductive plate 320 is interposed between the first conductive plate 310 and the third conductive plate 360; and a second switch element 370 comprising a switch and selectively electrically connected between the sixth point 322 of the second conductive plate 320 and the seventh point 361 of the third conductive plate 360.

Figure 4:
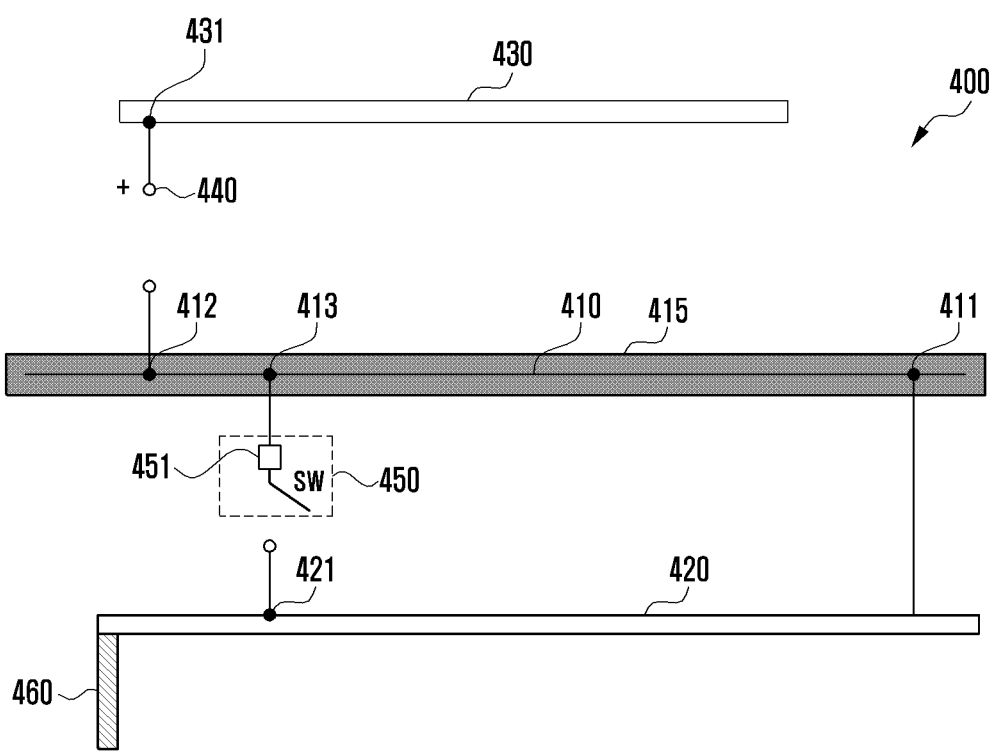
FIG. 4 is a diagram illustrating an example antenna structure according to various embodiments.

FIG. 4 is a diagram illustrating an example antenna structure according to various embodiments;

Referring to FIG. 4, an antenna structure 400 (e.g., the antenna module 197 in FIG. 1 or the antenna structure 200 in FIG. 2) may include a first conductive plate 410, a second conductive plate 420, a conductive pattern 430, a feeding portion 440, a switch element 450, and an external connection structure 460. According to some embodiments, at least one of the components may be omitted from the antenna structure 400 or other components may be added to the antenna structure 400.

Referring to FIG. 4, the first conductive plate 410, the second conductive plate 420, the conductive pattern 430, the feeding portion 440, and the switch element 450 are substantially the same as or similar to the first conductive plate 210, the second conductive plate 220, the conductive pattern 230, the feeding portion 240, and the switch element 250 of FIG. 2, respectively. Therefore, a detailed description overlapping the description made with reference to FIG. 2 may not be repeated here. For example, an electronic device (e.g., the electronic device 101 in FIG. 1) may include a first conductive plate 410, and a second conductive plate 420 spaced apart from the first conductive plate 410 and substantially parallel to the first conductive plate 410, wherein the second conductive plate 420 may be disposed to at least partially overlap the first conductive plate 410 when viewed from above the first conductive plate 410. The second conductive plate 420 may be electrically connected to a first point 411 of the first conductive plate 410. The electronic device may include a conductive pattern 430 spaced apart from the first conductive plate 410 and substantially parallel to the first conductive plate 410, wherein the conductive pattern 430 may be disposed to at least partially overlap the first conductive plate 410 when viewed from above the first conductive plate 410. The first conductive plate 410 may be interposed between the conductive pattern 430 and the second conductive plate 420. The electronic device may include a wireless communication circuit (e.g., the communication module 190 in FIG. 1) electrically connected to the second point 431 of the conductive pattern 430, wherein the second point 431 overlaps a third point 412 of the first conductive plate 410 when viewed from above the first conductive plate 410. The electronic device may include a switch element 450 comprising a switch selectively electrically connected between a fourth point 413 of the first conductive plate 410 and a fifth point 421 of the second conductive plate 420. The fourth point 413 may be closer to the third point 412 than to the first point 411.

According to various embodiments, the antenna structure 400 may include an external connection structure (e.g., including a connecting circuit) 460 configured to electrically connect the second conductive plate to a ground portion of an external device. The ground portion of the external device may include, for example, a ground portion of an ear jack, a ground region of a USB, or a connecting portion of a metal watch strap. When the ground portion of the external device is coupled to the antenna structure 400 via the external connection structure 460, the antenna structure 400 may use the ground portion of the external device as well as the first conductive plate 410 and the second conductive plate 420 as a ground portion of a monopole antenna.

According to various embodiments, the antenna structure 400 may further include an external connection structure 460 configured to electrically connect the second conductive plate to a ground portion of an external device.

Figure 5:
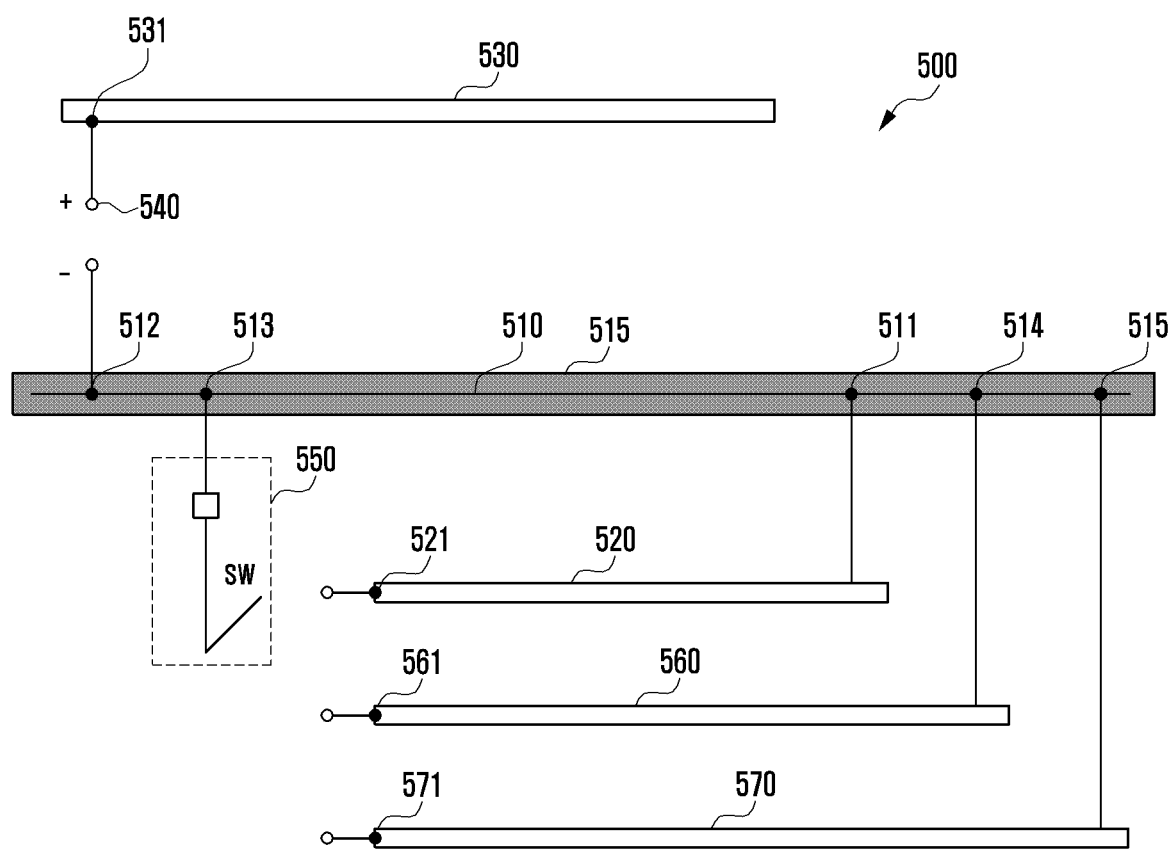
FIG. 5 is a diagram illustrating an example antenna structure according to various embodiments.

FIG. 5 is a diagram illustrating an example antenna structure according to various embodiments;

Referring to FIG. 5, an antenna structure 500 (e.g., the antenna module 197 in FIG. 1) may include a first conductive plate 510, a second conductive plate 520, a conductive pattern 530, a feeding portion 540, a switch element 550, a third conductive plate 560, and a fourth conductive plate 570. According to some embodiments, at least one of the components may be omitted from the antenna structure 500 or other components may be added to the antenna structure 300.

Referring to FIG. 5, the first conductive plate 510, the second conductive plate 520, the conductive pattern 530, the feeding portion 540, and the switch element 550 are substantially the same as or similar to the first conductive plate 210, the second conductive plate 220, the conductive pattern 230, the feeding portion 240, and the switch element 250 of FIG. 2, respectively. Therefore, a detailed description overlapping the description made with reference to FIG. 2 may not be repeated here. For example, an electronic device (e.g., the electronic device 101 in FIG. 1) may include a first conductive plate 510, and a second conductive plate 520 spaced apart from the first conductive plate 510 and substantially parallel to the first conductive plate 510, wherein the second conductive plate 320 may be disposed to at least partially overlap the first conductive plate 510 when viewed from above the first conductive plate 510. The second conductive plate 520 may be electrically connected to a first point 511 of the first conductive plate 510. The electronic device may include a conductive pattern 530 spaced apart from the first conductive plate 510 and substantially parallel to the first conductive plate 510, wherein the conductive pattern 530 may be disposed to at least partially overlap the first conductive plate 510 when viewed from above the first conductive plate 510. The first conductive plate 510 may be interposed between the conductive pattern 530 and the second conductive plate 520. The electronic device may include a wireless communication circuit (e.g., the communication module 190 in FIG. 1) electrically connected to the second point 531 of the conductive pattern 530, wherein the second point 531 overlaps a third point 512 of the first conductive plate 510 when viewed from above the first conductive plate 510. The electronic device may include a switch element 550 comprising a switch selectively electrically connected between a fourth point 513 of the first conductive plate 510 and a fifth point 521 of the second conductive plate 520. The fourth point 513 may be closer to the third point 512 than to the first point 511.

According to various embodiments, the antenna structure 500 may include a third conductive plate 560 and/or a fourth conductive plate 570. According to an embodiment, the third conductive plate 560 and the fourth conductive plate 570 may be selectively electrically connected to a sixth point 514 and a seventh point 515, respectively, of the first conductive plate 510. According to an embodiment, the sixth point 514 may be farther from the fourth point 513 than the fourth point 513 is from the first point 511. The seventh point 515 may be farther from the fourth point 513 than the fourth point 513 is from the sixth point 514. According to an embodiment, the third conductive plate 560 and/or the fourth conductive plate 570 may extend at least partially in a direction toward the fourth point 513, to be parallel to the first conductive plate 510.

According to various embodiments, the second conductive plate 520, the third conductive plate 560, and the fourth conductive plate 570 may have different lengths. The second conductive plate 520, the third conductive plate 560, and the fourth conductive plate 570, which have different lengths, may support different resonance frequencies. For example, the second conductive plate 520 may support a frequency higher than that supported by the third conductive plate 560, and the third conductive plate 560 may support a frequency higher than that supported by the fourth conductive plate 570. Although not illustrated, the second conductive plate 520, the third conductive plate 560, and the fourth conductive plate 570 may be connected to different ground portions in order to prevent and/or reduce interference of radio waves. For example, when the printed circuit board 515 includes the first ground portion, the second ground portion, and the third ground portion, the second conductive plate 520 may be connected to the first ground portion, the third conductive plate 560 may be connected to the second ground portion, and the fourth conductive plate 570 may be connected to the third ground portion.

According to various embodiments, the switch element 550 may selectively connect the second conductive plate 520, the third conductive plate 560, or the fourth conductive plate 570.

According to various embodiments, the switch element 550 may include an SPxT (e.g., SP4T) switch. For example, when the SPxT switch capable of transmitting one input signal to a plurality of paths is used, the second conductive plate 520, the third conductive plate 560, or the fourth conductive plate 570 may be selectively connected to the first conductive plate 510. For example, the switch element 550 may electrically connect the fourth point 513 of the first conductive plate 510 to the fifth point 521 of the second conductive plate 520, an eighth point 561 of the third conductive plate 560, or a ninth point 571 of the fourth conductive plate 570.

According to various embodiments, the electronic device (e.g., the electronic device 101 in FIG. 1) may further include: a third conductive plate 360, which is spaced apart from the first conductive plate 510 and substantially parallel to the first conductive plate 510 and at least partially overlaps the first conductive plate 510 when viewed from above the first conductive plate 510, and the switch element 550 may selectively connect one of the second conductive plate 520 and the third conductive plate 560 to the first conductive plate 510.

Figure 6:
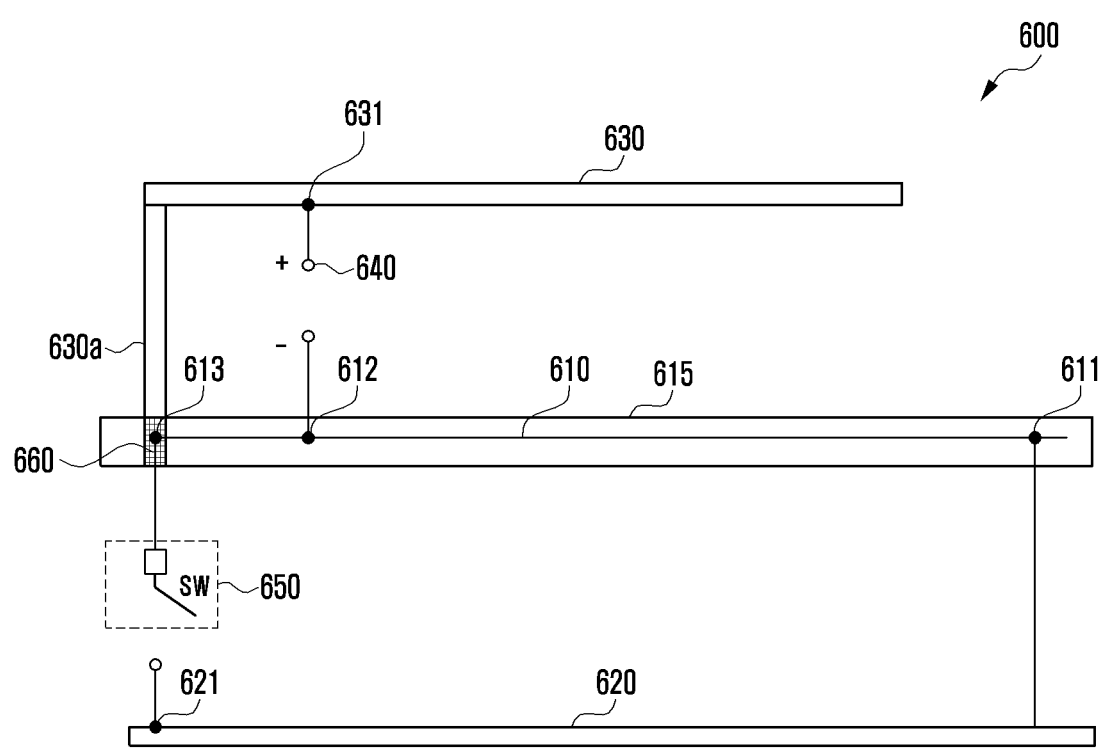
FIG. 6 is a diagram illustrating an example antenna structure according to various embodiments.

FIG. 6 is a diagram illustrating an example antenna structure according to various embodiments;

Referring to FIG. 6, an antenna structure 600 (e.g., the antenna module 197 in FIG. 1) may include a first conductive plate 610, a second conductive plate 620, a conductive pattern 630, a feeding portion 640, a switch element (e.g., including a switch) 650, and a via hole 660. According to some embodiments, at least one of the components may be omitted from the antenna structure 600 or other components may be added to the antenna structure 600.

Referring to FIG. 6, the first conductive plate 610, the second conductive plate 620, the conductive pattern 630, the feeding portion 640, and the switch element 650 are substantially the same as the first conductive plate 210, the second conductive plate 220, the conductive pattern 230, the feeding portion 240, and the switch element 250 of FIG. 2, respectively. Therefore, a detailed description overlapping the description made with reference to FIG. 2 may not be repeated here. For example, an electronic device (e.g., the electronic device 101 in FIG. 1) may include a first conductive plate 610, and a second conductive plate 620 spaced apart from the first conductive plate 610 and substantially parallel to the first conductive plate 610, wherein the second conductive plate 620 may be disposed to at least partially overlap the first conductive plate 610 when viewed from above the first conductive plate 610. The second conductive plate 620 may be electrically connected to a first point 611 of the first conductive plate 610. The electronic device may include a conductive pattern 630 spaced apart from the first conductive plate 610 and substantially parallel to the first conductive plate 610, wherein the conductive pattern 630 may be disposed to at least partially overlap the first conductive plate 610 when viewed from above the first conductive plate 610. The first conductive plate 610 may be interposed between the conductive pattern 630 and the second conductive plate 620. The electronic device may include a wireless communication circuit (e.g., the communication module 190 in FIG. 1) electrically connected to the second point 631 of the conductive pattern 630, in which the second point 631 overlaps a third point 612 of the first conductive plate 610 when viewed from above the first conductive plate 610. The electronic device may include a switch element 650 comprising a switch selectively electrically connected between a fourth point 613 of the first conductive plate 610 and a fifth point 621 of the second conductive plate 620.

According to various embodiments, a portion 630a of the conductive pattern 630 may be electrically connected to the first conductive plate 610. By connecting a portion 630a of the conductive pattern 630 to the first conductive plate 610, the conductive pattern 630 may be formed of an Inverted F Antenna (IFA) or a Planar Inverted F Antenna (PIFA) including a ground portion, a feeding portion, and a radiator.

According to various embodiments, the switch element 650 may electrically connect the portion 630a of the conductive pattern 630 and the fifth point 621 of the second conductive plate 620 via the via hole 660. For example, at least a portion of the printed circuit board 615 may be formed as a via hole in the form in which vias are coupled, and the second conductive plate 620 may be connected to the portion 630a of the conductive pattern 630 and/or the first conductive plate 610 via the formed via hole. When the switch element 650 is connected to the conductive pattern 630 through the via hole 660, a larger ground portion may be formed.

An electronic device (e.g., the electronic device 101 in FIG. 1) according to various embodiments may include: a first conductive plate 610; a second conductive plate 620 spaced apart from the first conductive plate 610 and substantially parallel to the first conductive plate 610, wherein the second conductive plate 620 at least partially overlaps the first conductive plate 610 when viewed from above the first conductive plate 610 and is electrically connected to a first point 611 of the first conductive plate 610; a conductive pattern 630 spaced apart from the first conductive plate 610 and substantially parallel to the first conductive plate 610, wherein the conductive pattern 630 at least partially overlaps the first conductive plate 610 when viewed from above the first conductive plate 610 and the first conductive plate 610 is interposed between the conductive pattern 630 and the second conductive plate 620; a wireless communication circuit (e.g., the communication module 190 in FIG. 1) electrically connected to a second point 631 of the conductive pattern 630, wherein the second point 631 overlaps a third point 612 of the first conductive plate 610 when viewed from above the first conductive plate 610; and a switch element 650 electrically connected between a fourth point 613 of the first conductive plate 610 and a fifth point 621 of the second conductive plate 620, wherein the third point 612 is located between the fourth point 613 and the first point 611. At least a portion 630a of the conductive pattern 630 may be electrically connected to the fourth point 613 of the first conductive plate 610 via a via hole 660.

Figure 7:
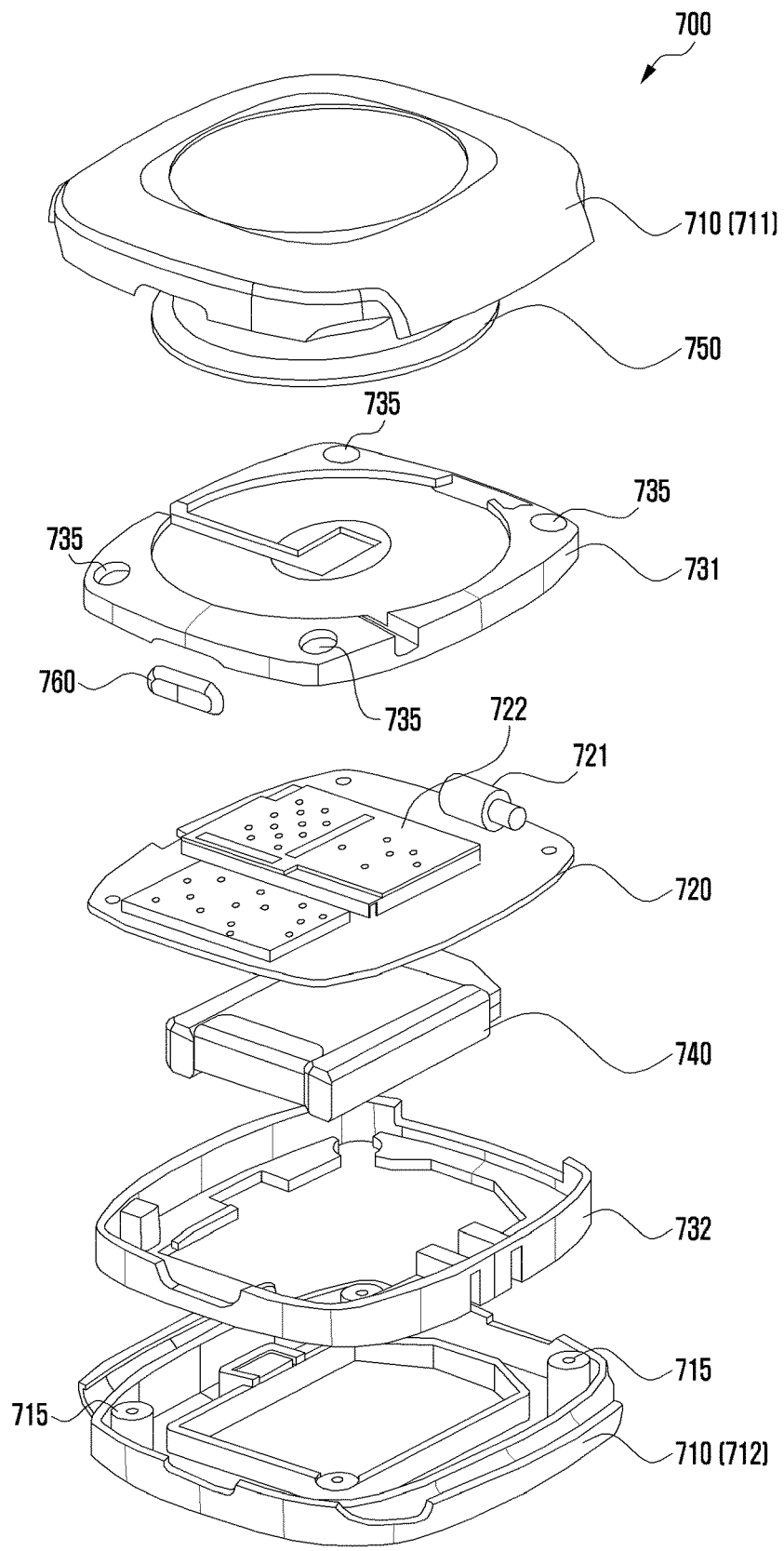
FIG. 7 is an exploded perspective view illustrating an example electronic device including an antenna structure according to various embodiments of the present disclosure.

FIG. 7 is an exploded perspective view illustrating an example electronic device including an antenna structure according to various embodiments of the present disclosure.

Referring to FIG. 7, an electronic device 700 according to various embodiments of the present disclosure (e.g., the electronic device 101 in FIG. 1) may include a housing 710, a printed circuit board 720, a first support member 731, a second support member 732, a battery 740, a display 750, and an operation key 760. According to some embodiments, at least one of the components may be omitted from the electronic device or other components may be added to the electronic device.

According to various embodiments, the housing 710 may include a first housing 711 and a second housing 712. For example, the first housing 711 and the second housing 712 may be coupled to each other to form the housing 710. According to an embodiment, the housing 710 may include the first housing 711 or the second housing 712. For example, the first housing 711 and the second housing 712 may be coupled using housing fastening portions 715. According to some embodiments, the housing 710 may further include a side member (e.g., side surface) at least partially surrounding the space between the first housing 711 and the second housing 712. According to an embodiment, components of the electronic device 700 (e.g., the printed circuit board 720, the first support member 731, the second support member 732, the battery 740, and an operation key 760) may be located inside the first housing 711 and the second housing 712. The first housing 711 and the second housing 712 are able to, for example, accommodate the components of the electronic device 700 and to protect these components from an external impact. According to an embodiment, each of the first housing 711 and the second housing 712 may include a metal frame structure. According to an embodiment, the first housing 711 and the second housing 712 may include a plastic injection-molded product disposed between the metal frame structures.

According to various embodiments, the printed circuit board 720 (e.g., the printed circuit board 215 in FIG. 2) may be located within the housing 710. For example, the printed circuit board 720 may be located between the first housing 711 and the second housing 712. According to an embodiment, the printed circuit board 720 may include a first conductive plate (e.g., the first conductive plate 210 in FIG. 2), a wireless communication circuit (e.g., the communication module 190 in FIG. 1), and a switch element (e.g., the switch element 250 in FIG. 2). According to an embodiment, the printed circuit board 720 may include a vibrator 721. For example, the electronic device 700 may generate a vibration pattern using the vibrator 721 and may provide tactile feedback to the user. According to an embodiment, the printed circuit board 720 may include a shield can 722. The shield can 722 may be formed to shield various electromagnetic waves generated in the printed circuit board 720, for example.

According to various embodiments, the first support member 731 may be positioned between the printed circuit board 720 and the first housing 711, and may include a second conductive plate (e.g., the second conductive plate 220 in FIG. 2) electrically connected to the first conductive plate (e.g., the first conductive plate 210 in FIG. 2) included in the printed circuit board 720. The first support member 731 may function as a body for forming the second conductive plate as a metal pattern. At least a portion of the first support member 731 may be made of a dielectric material. As another example, when the first support member 731 is coupled with the printed circuit board 720, the switch element included in the printed circuit board 720 may be connected to the second conductive plate.

According to various embodiments, the second support member 732 may be positioned between the printed circuit board 720 and the second housing 712, and may include a conductive pattern (e.g., the conductive pattern 230) electrically connected to the wireless communication circuit included in the printed circuit board 720. The second support member 732 may function as a body for forming the conductive pattern as a metal pattern. At least a portion of the second support member 732 may be made of a dielectric material. According to an embodiment, the first support member 731 and the second support member 732 may be coupled using support member fastening portions 735.

According to various embodiments, the battery 740 may be located between the printed circuit board 720 and the second support member 732. According to an embodiment, the battery 740 may include a rechargeable battery and/or a solar cell.

According to various embodiments, the display 750 may be located between the first housing 711 and the first support member 731. The display 750 may be exposed through a substantial portion of the first housing 711, for example. In some embodiments, the display 750 may be formed to be generally similar to the shape of the adjacent outer contour of the first housing 711. In another embodiment (not illustrated), the distance between the outer contour of the display 750 and the outer contour of the first housing 711 may be substantially constant in order to enlarge the exposed area of the display 750.

According to an embodiment, the operation key 760 may be a user operation button for operating the electronic device. For example, the operation key 760 may be formed in a physical button type to sense a push input of the user, and may transmit push information to a processor when the push input of the user is sensed.

According to various embodiments, an electronic device 700 may include: a housing 710 including a first housing 711 and a second housing 712; a printed circuit board 720 including a first conductive plate (e.g., the first conductive plate 210 in FIG. 2), a wireless communication circuit (e.g., the communication module 190 in FIG. 1) electrically connected to a second point (e.g., the second point 231 in FIG. 2) of a conductive pattern (e.g., the conductive pattern 230 in FIG. 2), and a switch element (e.g., the switch element 250 in FIG. 2) comprising a switch selectively electrically connecting a fourth point (e.g., the fourth point 213 in FIG. 2) of the first conductive plate (e.g., the first conductive plate 210 in FIG. 2) and a fifth point (e.g., the fifth point 221 in FIG. 2) of a second conductive plate (e.g., the second conductive plate 220 in FIG. 2); a first support member 731 located between the printed circuit board 720 and the first housing 711 and including the second conductive plate electrically connected to a first point (e.g., the first point 211 in FIG. 2) of the first conductive plate; a second support member 732 located between the printed circuit board 720 and the second housing 712 and including the conductive pattern; and a processor (e.g., the first processor 120 in FIG. 1). The processor may be configured to control a connection between the fourth point of the first conductive plate and the fifth point of the second conductive plate using the switch element, and when viewed from above the first conductive plate, the second point may overlap a third point (e.g., the third point 212 in FIG. 2) of the first conductive plate and the fourth point may be closer to the third point than to the first point.

According to various embodiments, a conductive pattern (e.g., the conductive pattern 230 in FIG. 2) of the electronic device 700 may include a conductive line including a first end (e.g., the first end 232 in FIG. 2) and a second end (e.g., the second end 233 in FIG. 2), and the second point (e.g., the second point 231 in FIG. 2) may be located at or near the first end.

According to various embodiments, the conductive line of the electronic device 700 may not overlap the first point (e.g., the first point 211 in FIG. 2) when viewed from above the electronic device.

According to various embodiments, the electronic device 700 may further include a matching circuit (e.g., the matching circuit 251 in FIG. 2) between the switch element (e.g., the switch element 250 in FIG. 2) and the fifth point.

According to various embodiments, the electronic device 700 may further include: a third conductive plate (e.g., the third conductive plate 360 in FIG. 3) spaced apart from the first conductive plate and substantially parallel to the first conductive plate, wherein the third conductive plate at least partially overlaps the first conductive plate when viewed from above the first conductive plate and the second conductive plate is interposed between the first conductive plate and the third conductive plate; and a second switch element (e.g., the second switch element 370 in FIG. 3) comprising a switch to selectively electrically connect a sixth point (e.g., the sixth point 322 in FIG. 3) of the second conductive plate and a seventh point (the seventh point 361 in FIG. 3) of the third conductive plate.

According to various embodiments, the third conductive plate of the electronic device 700 may be included in the first housing 711 or the second housing 712.

According to various embodiments, the electronic device 700 may further include an external connection structure (e.g., the external connection structure 460 in FIG. 4) configured to electrically connect the second conductive plate to a ground portion of an external device.

According to various embodiments, the electronic device 700 may further include a third conductive plate (e.g., the third conductive plate 560 in FIG. 5) spaced apart from the first conductive plate and substantially parallel to the first conductive plate, wherein the third conductive plate at least partially overlaps the first conductive plate when viewed from above the first conductive plate, and the first switch element may selectively connect at least one of the second conductive plate and the third conductive plate.

According to various embodiments, the third conductive plate of the electronic device 700 may be included in the first housing 711 or the second housing 712.

According to various embodiments, the electronic device 700 may include a display 750, and the second conductive plate may be electrically connected to a ground portion of the display.

Figure 8A:
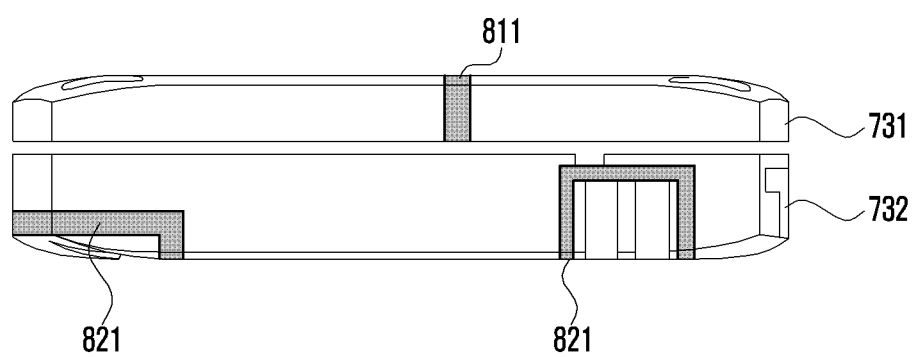
FIGS. 8A, 8B and 8C are diagrams illustrating an example mounting structure of an antenna structure in an electronic device according to various embodiments.
Figure 8B:
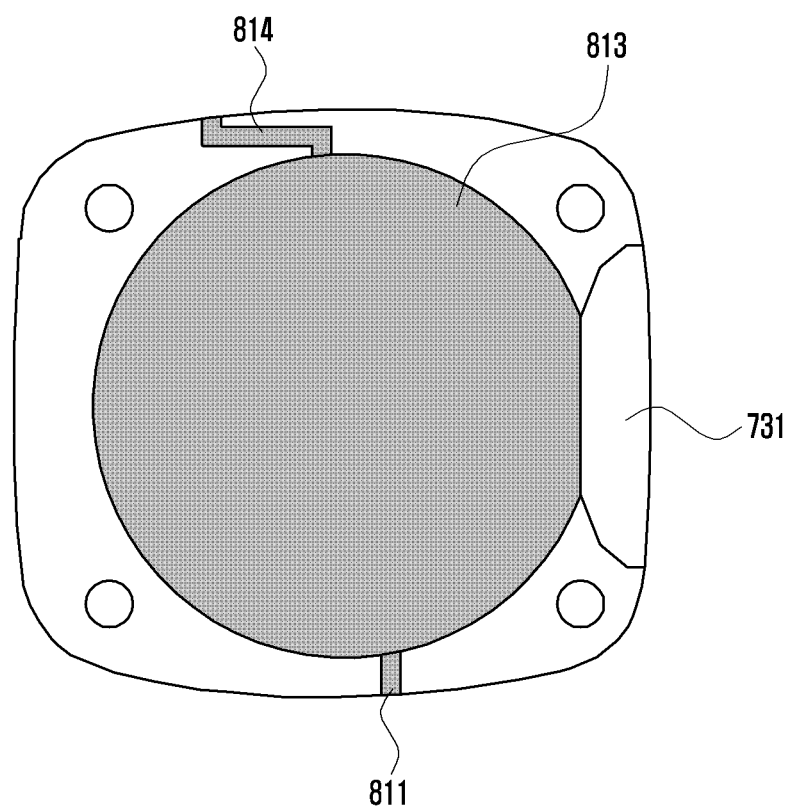
Figure 8C:
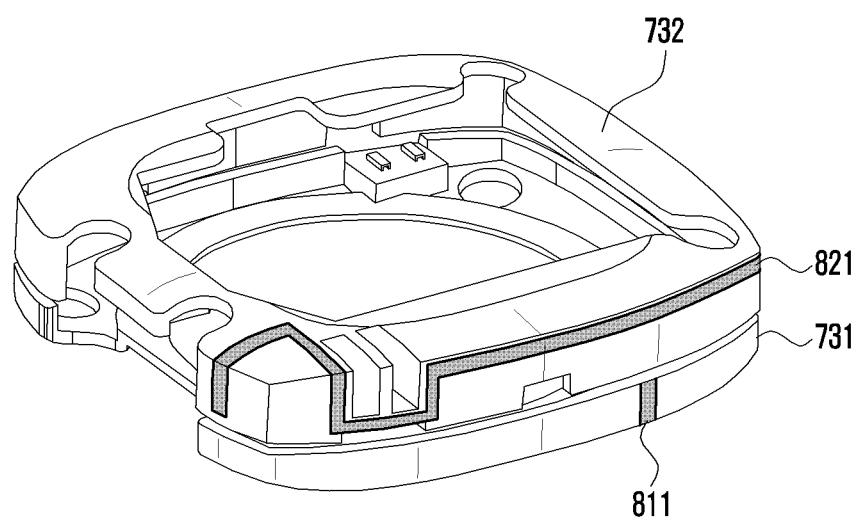

FIGS. 8A, 8B and 8C are diagrams illustrating an example mounting structure of an antenna structure in an electronic device according to various embodiments.

FIG. 8A is a side view illustrating the first support member 731 and the second support member 732 when they are coupled to each other. FIG. 8B is a plan view illustrating the first support member 731 and the second support member 732 when they are coupled to each other, and FIG. 8C is a perspective view corresponding to FIG. 8B.

According to an embodiment, the first support member 731 and the second support member 732 may be coupled to each other. Although not illustrated, the first and second support members 731 and 732 may be coupled to each other in the state of including a printed circuit board (e.g., the printed circuit board 720 in FIG. 7) or a battery (e.g., the battery 740 in FIG. 7) therein.

According to various embodiments, the second conductive plate (e.g., the second conductive plate 220 in FIG. 2) may include a first connection member 811, a second connection member 814, and a ground plane 813. According to an embodiment, the first support member 731 may include the first connection member 811 such that the switch element (e.g., the switch element 250 in FIG. 2) included in the printed circuit board 720 is electrically connected to the ground plane 813 formed on the first support member 731. For example, when the switch element is short-circuited, the first conductive plate included in the printed circuit board 720 may be electrically connected to the ground plane 813 via the first connection member 811.

According to various embodiments, the second support member 732 may include a conductive pattern 821 electrically connected to a wireless communication circuit (e.g., the communication module 190 in FIG. 1) included in the printed circuit board 720. The second support member 732 may function as a body for forming the conductive pattern 821 as a metal pattern.

According to various embodiments, the ground plane 813 may be electrically connected to the switch element included in the printed circuit board 720 via the first connection member 811. As another example, the ground plane 813 may be connected to a first conductive plate (e.g., the first conductive plate 210 of FIG. 2) included in the printed circuit board 720 via the second connection member 814.

Figure 9:
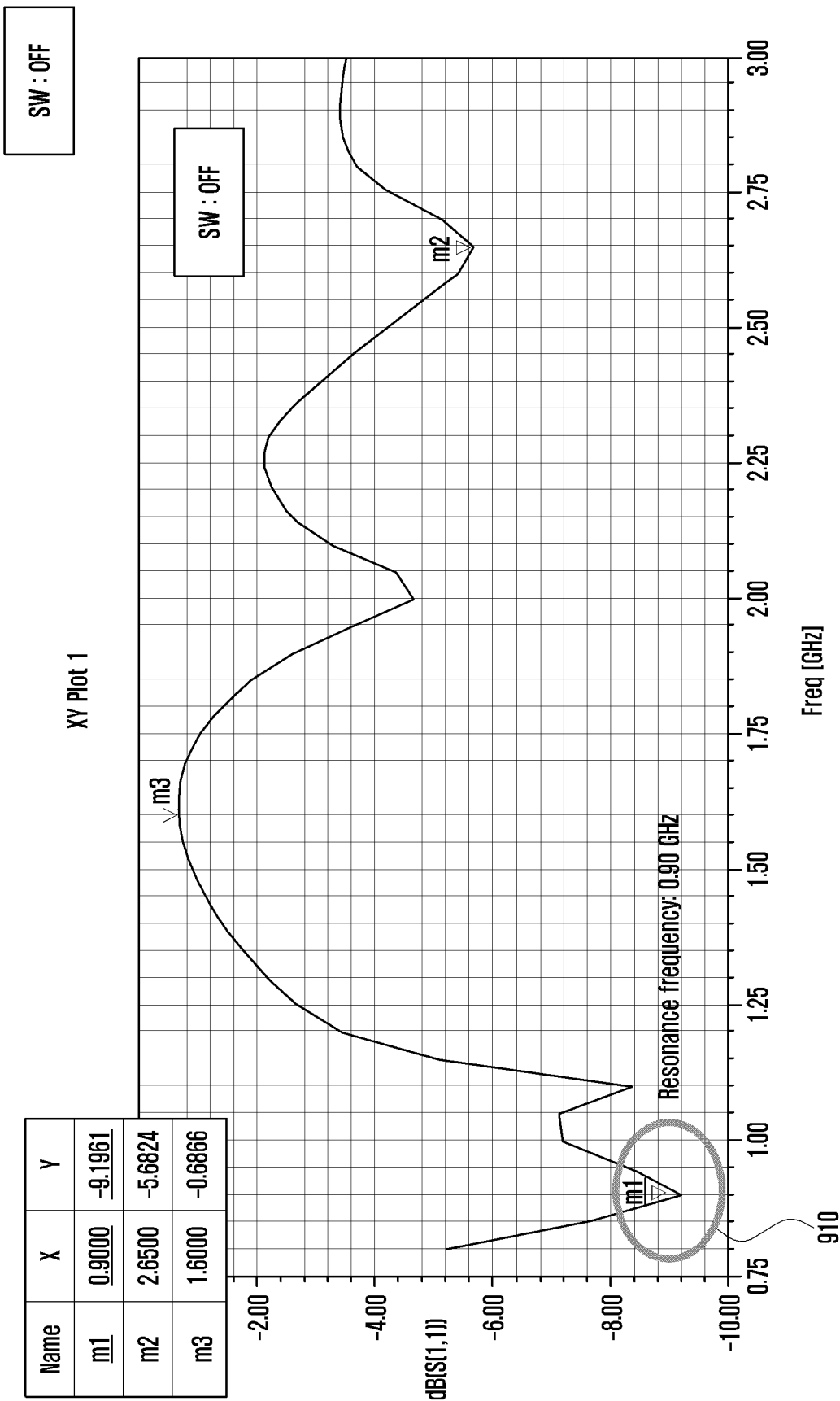
FIGS. 9 and 10 are diagrams illustrating results of comparative experiments on results at switching ON/OFF of an antenna structure according to various embodiments.
Figure 10:
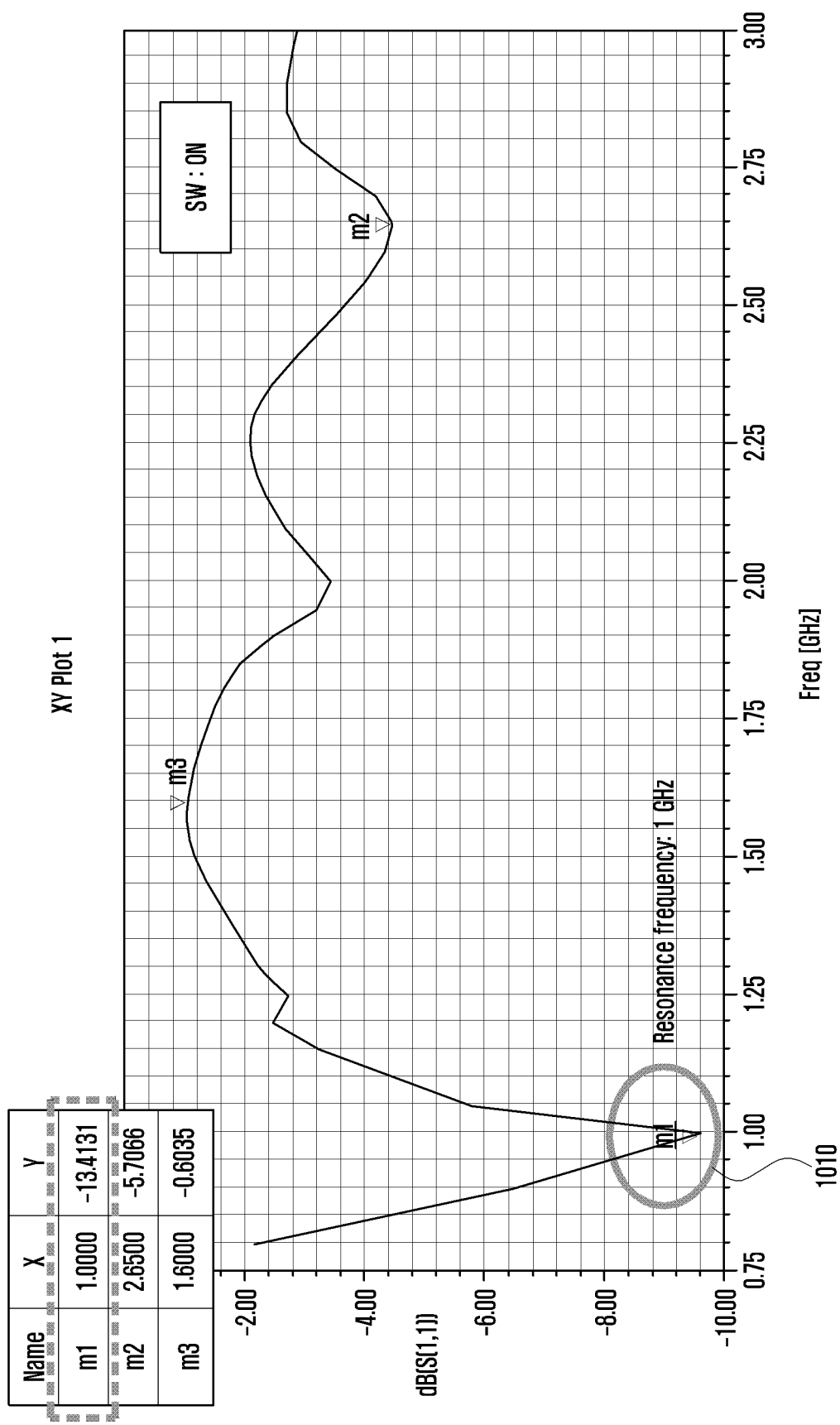

FIGS. 9 and 10 are graphs illustrating results of comparative experiments on results at switching ON/OFF of an antenna structure according to various embodiments.

Referring to FIG. 9, resonance frequency characteristics when a switch element (e.g., the switch element 250 in FIG. 2) is open is shown. It can be seen that by opening the switch element, the antenna structure (e.g., the antenna structure 200 in FIG. 2) has a resonance frequency 910 in the about 0.90 GHz band. Referring to FIG. 10 showing resonance frequency characteristics when the switch is short-circuited (e.g., closed), it can be seen that the antenna structure has a resonance frequency 1010 in the about 1 GHz band. For example, it is possible to reduce the degradation of the radio transmission output and to shift the resonance frequency band using the switch element.

Figure 11:
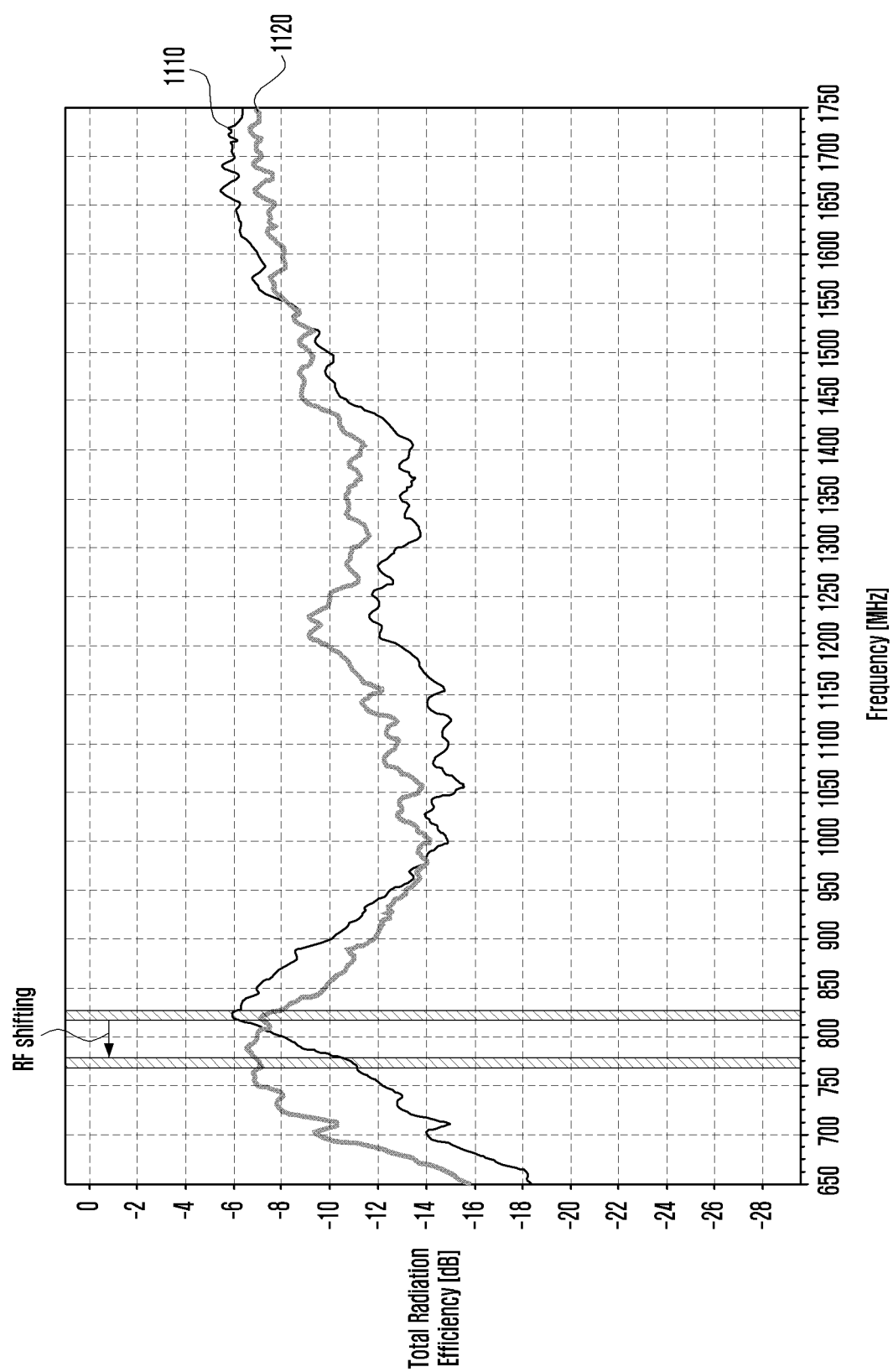
FIG. 11 is a diagram illustrating frequency characteristics at switching ON/OFF of an antenna structure according to various embodiments.

FIG. 11 is a graph illustrating frequency characteristics at switching ON/OFF of an antenna structure according to various embodiments.

FIG. 11 shows frequency characteristics 1110 when the switch element (e.g., switch element 250 in FIG. 2) is opened and the frequency characteristics 1120 when the switch element is short-circuited. It can be seen that the resonant frequency band can be shifted although there is almost no decrease in the radio transmission output regardless of switching ON/OFF.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the present disclosure has been illustrated and described with reference to various example embodiments, it will be understood that the various example embodiments are intended to be illustrative, not limiting. Therefore, various changes in form and details may be made without departing from the spirit and scope of the disclosure as may be defined, for example, by the appended claims and their equivalents.

What is claimed is:

1. An electronic device comprising:
   a first conductive plate;
   a second conductive plate spaced apart from the first conductive plate and substantially parallel to the first conductive plate, wherein the second conductive plate at least partially overlaps the first conductive plate when viewed from above the first conductive plate and the second conductive plate is electrically connected to a first point of the first conductive plate;
   a conductive pattern spaced apart from the first conductive plate and substantially parallel to the first conductive plate, wherein the conductive pattern at least partially overlaps the first conductive plate when viewed from above the first conductive plate and the first conductive plate is interposed between the conductive pattern and the second conductive plate;
   a wireless communication circuit electrically connected to a second point of the conductive pattern, wherein the second point overlaps a third point of the first conductive plate when viewed from above the first conductive plate; and
   a switch element comprising a switch configured to selectively electrically connect a fourth point of the first conductive plate and a fifth point of the second conductive plate, wherein the fourth point of the first conductive plate is closer to the third point of the first conductive plate than the fourth point of the first conductive plate is to the first point of the first conductive plate.

2. The electronic device of claim 1, wherein the conductive pattern includes a conductive line including a first end and a second end, and the second point is located at or near the first end.

3. The electronic device of claim 2, wherein the conductive line does not overlap the first point when viewed from above the first conductive plate.

4. The electronic device of claim 2, further comprising:
   a matching circuit connected between the switch element and the fifth point.

5. The electronic device of claim 1, further comprising:
a printed circuit board including the first conductive plate.

6. The electronic device of claim 1, further comprising:
a third conductive plate spaced apart from the first conductive plate and substantially parallel to the first conductive plate, wherein the third conductive plate at least partially overlaps the first conductive plate when viewed from above the first conductive plate and the second conductive plate is interposed between the first conductive plate and the third conductive plate; and
a second switch element comprising a switch configured to selectively electrically connect a sixth point of the second conductive plate and a seventh point of the third conductive plate.

7. The electronic device of claim 1, further comprising:
an external connection configured to electrically connect the second conductive plate to a ground portion of an external device.

8. The electronic device of claim 1, further comprising:
a third conductive plate spaced apart from the first conductive plate and substantially parallel to the first conductive plate, wherein the third conductive plate at least partially overlaps the first conductive plate when viewed from above the first conductive plate, and the switch element is configured to selectively connect the second conductive plate or the third conductive plate to the first conductive plate.

9. An electronic device comprising:
a first conductive plate;
a second conductive plate spaced apart from the first conductive plate and substantially parallel to the first conductive plate, wherein the second conductive plate at least partially overlaps the first conductive plate when viewed from above the first conductive plate and the second conductive plate is electrically connected to a first point of the first conductive plate;
a conductive pattern spaced apart from the first conductive plate and substantially parallel to the first conductive plate, wherein the conductive pattern at least partially overlaps the first conductive plate when viewed from above the first conductive plate and the first conductive plate is interposed between the conductive pattern and the second conductive plate;
a wireless communication circuit electrically connected to a second point of the conductive pattern, wherein the second point overlaps a third point of the first conductive plate when viewed from above the first conductive plate; and
a switch element comprising a switch configured to selectively electrically connect a fourth point of the first conductive plate and a fifth point of the second conductive plate, wherein the third point is located between the fourth point and the first point,
wherein at least a portion of the conductive pattern is electrically connected to the fourth point of the first conductive plate via a via hole.

10. The electronic device of claim 9, wherein the conductive pattern includes a conductive line including a first end and a second end, and the fourth point is located at or near the first end.

11. An electronic device comprising:
a housing including a first housing and a second housing;
a printed circuit board including a first conductive plate, a wireless communication circuit electrically connected to a second point of a conductive pattern, and a switch element comprising a switch configured to selectively electrically connect a fourth point of the first conductive plate and a fifth point of a second conductive plate;
a first support located between the printed circuit board and the first housing and including the second conductive plate electrically connected to a first point of the first conductive plate;
a second support located between the printed circuit board and the second housing and including the conductive pattern; and
a processor,
wherein the processor is configured to control the switch element to control a connection between the fourth point of the first conductive plate and the fifth point of the second conductive plate, and
the second point of the conductive pattern overlaps a third point of the first conductive plate and the fourth point of the first conductive plate is closer to the third point of the conductive plate than the fourth point of the first conductive plate is to the first point of the first conductive plate.

12. The electronic device of claim 11, wherein the conductive pattern includes a conductive line including a first end and a second end, and the second point is located at or near the first end.

13. The electronic device of claim 12, wherein the conductive line does not overlap the first point when viewed from above the electronic device.

14. The electronic device of claim 12, further comprising:
a matching circuit disposed between the switch element and the fifth point.

15. The electronic device of claim 11, further comprising:
a third conductive plate spaced apart from the first conductive plate and substantially parallel to the first conductive plate, wherein the third conductive plate at least partially overlaps the first conductive plate when viewed from above the first conductive plate and the second conductive plate is interposed between the first conductive plate and the third conductive plate; and
a second switch element comprising a switch configured to selectively electrically connect a sixth point of the second conductive plate and a seventh point of the third conductive plate.

16. The electronic device of claim 15, wherein the third conductive plate is included in one of the first housing and the second housing.

17. The electronic device of claim 11, further comprising:
an external connection configured to electrically connect the second conductive plate to a ground portion of an external device.

18. The electronic device of claim 11, further comprising:
a third conductive plate spaced apart from the first conductive plate and substantially parallel to the first conductive plate, wherein the third conductive plate at least partially overlaps the first conductive plate when viewed from above the first conductive plate,
wherein the switch element is configured to selectively connect at least one of the second conductive plate and the third conductive plate.

19. The electronic device of claim 18, wherein the third conductive plate is included in one of the first housing and the second housing.

20. The electronic device of claim 11, further comprising:
a display,
wherein the second conductive plate electrically is connected to a ground portion of the display.

* * * * *